US007106113B2

(12) United States Patent
Gauthier et al.

(10) Patent No.: US 7,106,113 B2
(45) Date of Patent: *Sep. 12, 2006

(54) ADJUSTMENT AND CALIBRATION SYSTEM FOR POST-FABRICATION TREATMENT OF PHASE LOCKED LOOP INPUT RECEIVER

(75) Inventors: Claude R. Gauthier, Fremont, CA (US); Brian Amick, Austin, TX (US); Pradeep Trivedi, Sunnyvale, CA (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 957 days.

This patent is subject to a terminal disclaimer.

(21) Appl. No.: 10/147,841

(22) Filed: May 17, 2002

(65) Prior Publication Data

US 2003/0215042 A1    Nov. 20, 2003

(51) Int. Cl.
*H03L 7/06* (2006.01)
(52) U.S. Cl. .................... 327/156; 327/147; 327/162; 331/25
(58) Field of Classification Search ........ 327/154–156, 327/146, 147, 162; 331/25, 185, 1 A, 1 R, 331/DIG. 2
See application file for complete search history.

(56) References Cited

U.S. PATENT DOCUMENTS 6,046,646 A * 4/2000 Lo et al. ..................... 331/10
6,473,478 B1 * 10/2002 Wallberg et al. ............ 375/376
6,597,218 B1 * 7/2003 Gauthier et al. ............ 327/158
6,664,828 B1 * 12/2003 Gauthier et al. ............ 327/157
6,741,110 B1 * 5/2004 Roisen ....................... 327/158
6,753,740 B1 * 6/2004 Gauthier et al. ............ 331/185
6,768,955 B1 * 7/2004 Gauthier et al. ............. 702/75
6,778,027 B1 * 8/2004 Gauthier et al. ............. 331/17
6,784,752 B1 * 8/2004 Gauthier et al. ............. 331/16
6,882,195 B1 * 4/2005 Bui et al. .................... 327/161

OTHER PUBLICATIONS

"Low-Jitter Process-Independent DLL and PLL Based on Self-Biased Techniques", by John G. Maneatis, IEEE Journal of Solid-State Circuits, vol. 31, No. 11, Nov. 1996 (10 pages).

* cited by examiner

*Primary Examiner*—Timothy P. Callahan
*Assistant Examiner*—Hai L. Nguyen
(74) *Attorney, Agent, or Firm*—Osha Liang LLP

(57) ABSTRACT

An adjustment and calibration system for post-fabrication treatment of a phase locked loop input receiver is provided. The adjustment and calibration system includes at least one adjustment circuit, to which the phase locked loop input receiver is responsive, and a storage device that selectively stores control information (1) associated with a state of the adjustment circuit and/or (2) from a tester that writes such control information to the storage device, where the control information stored in the storage device is subsequently selectively read out in order to adjust the adjustment circuit to a state corresponding to the control information.

21 Claims, 10 Drawing Sheets

ADJUSTMENT AND CALIBRATION SYSTEM FOR POST-FABRICATION TREATMENT OF PHASE LOCKED LOOP INPUT RECEIVER

BACKGROUND OF INVENTION

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (referred to and known in the art as "reference clock" and shown in FIG. 1 as SYS_CLK) to various parts of the computer system 10. Modem microprocessors and other integrated circuits, however, are typically capable of operating at frequencies significantly higher than the system clock, and thus, it becomes important to ensure that operations involving the microprocessor 12 and the other components of the computer system 10 use a proper and accurate reference of time.

One component used within the computer system 10 to ensure a proper reference of time among a system clock and a microprocessor clock, i.e., "chip clock," is a type of clock generator known as a phase locked loop, or "PLL" 20. The PLL 20 is an electronic circuit that controls an oscillator such that the oscillator maintains a constant phase relative to a reference signal. Referring to FIG. 1, the PLL 20 has as its input the system clock, which is its reference signal, and outputs a chip clock signal (shown in FIG. 1 as CHIP_CLK) to the microprocessor 12. The system clock and chip clock have a specific phase and frequency relationship controlled by the PLL 20. This relationship between the phases and frequencies of the system clock and chip clock ensures that the various components within the microprocessor 12 use a controlled and accounted for reference of time. When this relationship is not maintained by the PLL 20, however, the operations within the computer system 10 become non-deterministic.

FIG. 2 shows a PLL 20 in more detail. The PLL 20 comprises a feedback loop that aligns the transition edge and frequency of the system clock 41 and a feedback loop signal 40. The PLL 20 adjusts the output frequency in order to zero any phase and frequency difference between the system clock 41 and the feedback loop signal 40. The addition of a divide-by-N circuit 39 in the feedback loop enables the PLL 20 to generate an output that has a frequency of N times the system clock 41 frequency. Multiplying the system clock is useful when the chip clock 42 must have a higher frequency than the system clock 41. The PLL core 36 adjusts the output frequency in order to zero any phase and frequency difference between the system clock 41 and the feedback loop signal 40. By adding the divide by N block 39, the chip clock 42 must be N times faster to allow the phase and frequency difference between the system clock 41 and the feedback loop signal 40 to zero. The PLL 20 may also have buffers 37 and 38 to drive a larger resistive and/or capacitive load. The buffers 37 and 38 are in the feedback loop so that any phase shift created by the buffers 37 and 38 is zeroed by the PLL core 36.

One common performance measure for a PLL is jitter. Jitter is the time domain error from poor spectral purity of an output. In other words, in a repeated output pattern, such as a clock signal, a transition that occurs from one state to another does not happen at the same time relative to other transitions. Jitter represents the perturbations that result in the intermittent shortening or lengthening of signal elements of an output. The system clock may have jitter that may need to be filtered by the PLL. The PLL may need to follow and compensate for jitter at the PLL output.

Phase locked loops are basically second order feedback control systems. As such, the phase locked loop can be described in the frequency domain as having a damping factor and natural frequency. The damping factor and natural frequency are fixed by the selection of the PLL circuit parameters. The loop bandwidth is defined as the PLL input frequency at which the PLL output magnitude is 3 dB lower than the PLL output magnitude when the PLL input frequency is zero (DC). The loop bandwidth determines to a large degree the speed at which the phase locked loop can react to a disturbance. The PLL should have a low loop bandwidth so that input clock jitter is filtered. Power supply noise will, however, have a certain noise-versus-frequency characteristic. The PLL loop bandwidth may need to be increased to recover from the generation of output jitter caused by power supply noise.

SUMMARY OF INVENTION

According to one aspect of the present invention, an integrated circuit comprises: a power supply; a phase locked loop operatively connected to the power supply, where the phase locked loop includes a voltage controlled oscillator that generates an output clock signal dependent on an input thereto, an input receiver comprising a system clock path and a feedback clock path, a phase frequency detector operatively connected to an output of the input receiver, and a bias generator (operatively connected to an output of the phase frequency detector), arranged to provide a voltage to the input of the voltage controlled oscillator; an adjustment circuit of which an output is operatively connected to the input receiver, where any one of the system clock path and the feedback clock path is responsive to the adjustment circuit; and a storing device adapted to store control information to which the adjustment circuit is operatively connected.

According to another aspect, an integrated circuit comprises: means for supplying power; phase locked loop means for inputting a system clock signal and outputting an output clock signal, where the phase locked means is operatively connected to the means for supplying power, and where the phase locked loop means includes means for inputting the system clock signal and a feedback clock signal, means for generating a control voltage, where the means for generating the control voltage is operatively connected to the means for inputting the system clock signal and the feedback clock signal, means for generating a bias voltage, where the means for generating the bias voltage is operatively connected to the control voltage, and means for generating the output clock signal, where the means for generating the output clock signal is operatively connected to the means for generating the bias voltage; means for adjusting the means for inputting the system clock signal and the feedback clock signal; and means for storing control information to which the means for adjusting the means for inputting the system clock signal and the feedback clock signal is selectively responsive.

According to another aspect, a method for post-fabrication treatment of an input receiver of a phase locked loop comprises: inputting a system clock signal and a feedback clock signal to the input receiver; selectively adjusting a delay of any one of the system clock signal and the feedback clock signal using an adjustment circuit of which an output is operatively connected to the input receiver, where the phase locked loop is responsive to any one of the system clock signal and the feedback clock signal; and storing at least a portion of control information determined from the selectively adjusting in a storage device, where the at least a portion of the control information to which the adjustment circuit is selectively responsive.

Other aspects and advantages of the invention will be apparent from the following description and the appended claims.

BRIEF DESCRIPTION OF DRAWINGS

FIG. 4b shows a phase locked loop input receiver in accordance with the embodiment shown in FIG. 4a.

FIG. 6b shows a timing diagram for the storage device shown in FIG. 6a.

DETAILED DESCRIPTION

Figure 1:
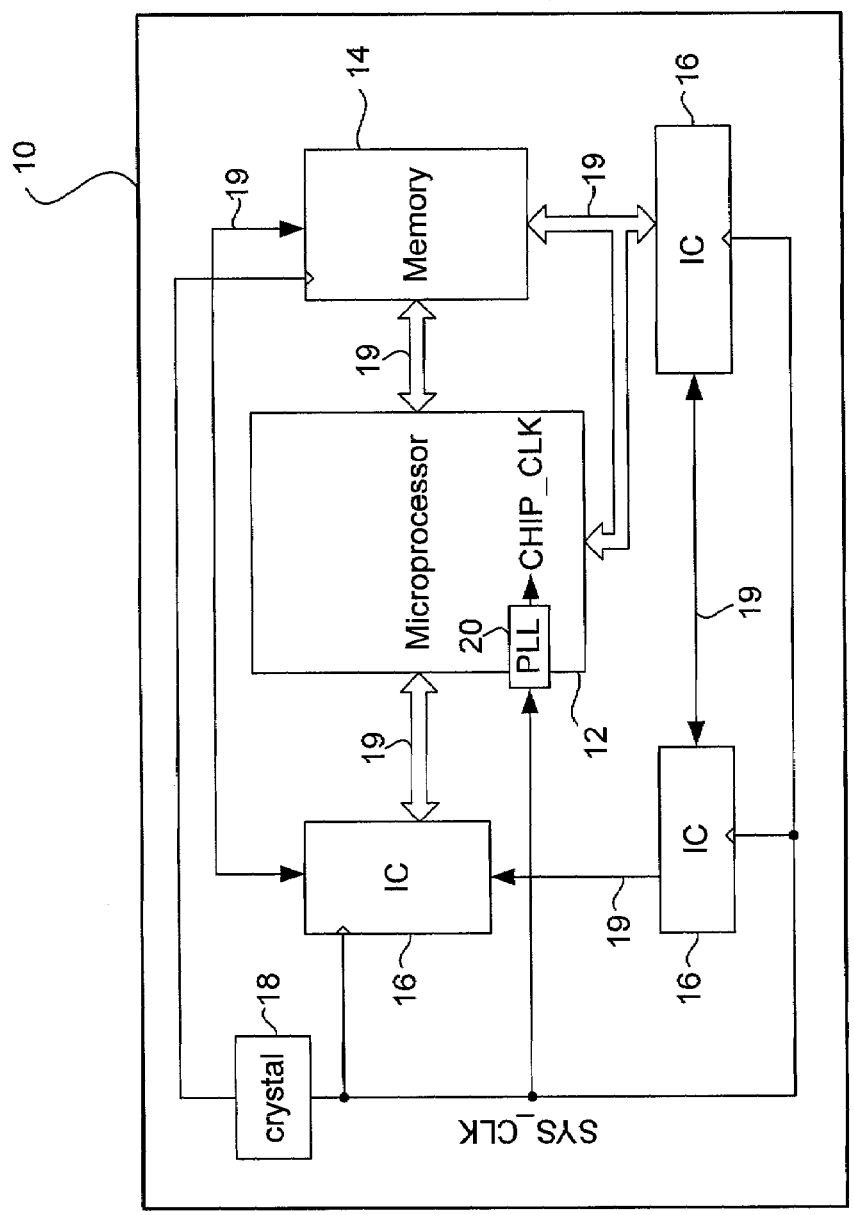
FIG. 1 shows a typical computer system.
Figure 2:
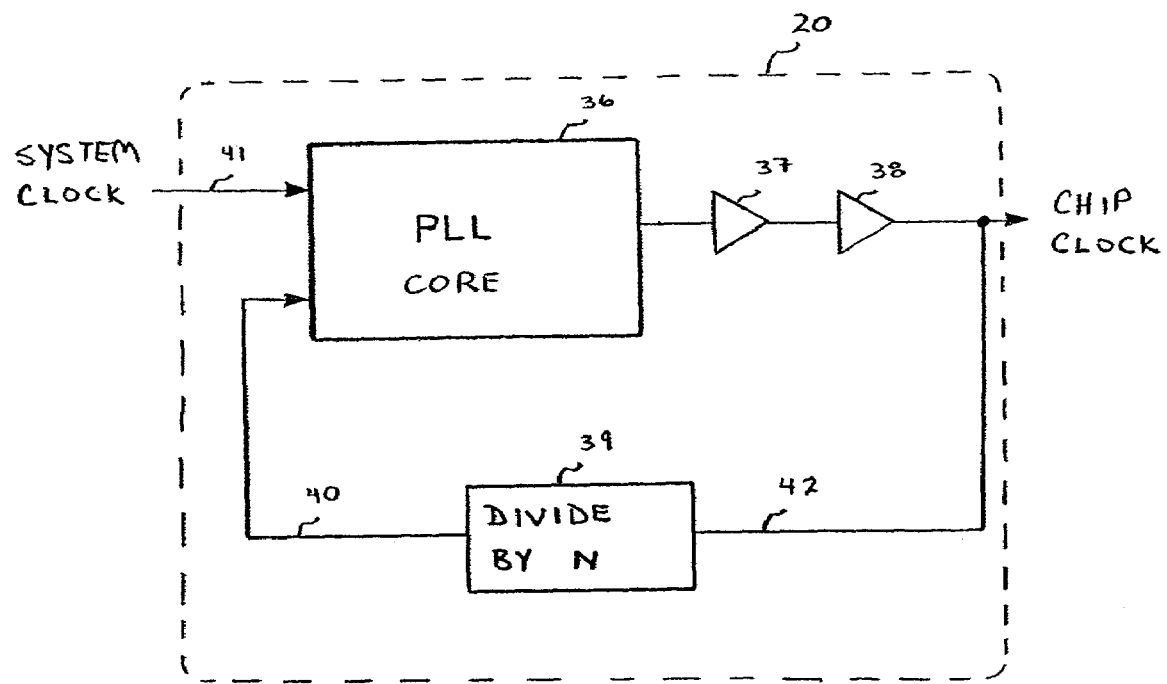
FIG. 2 shows a block diagram of a typical phase locked loop.
Figure 3A:
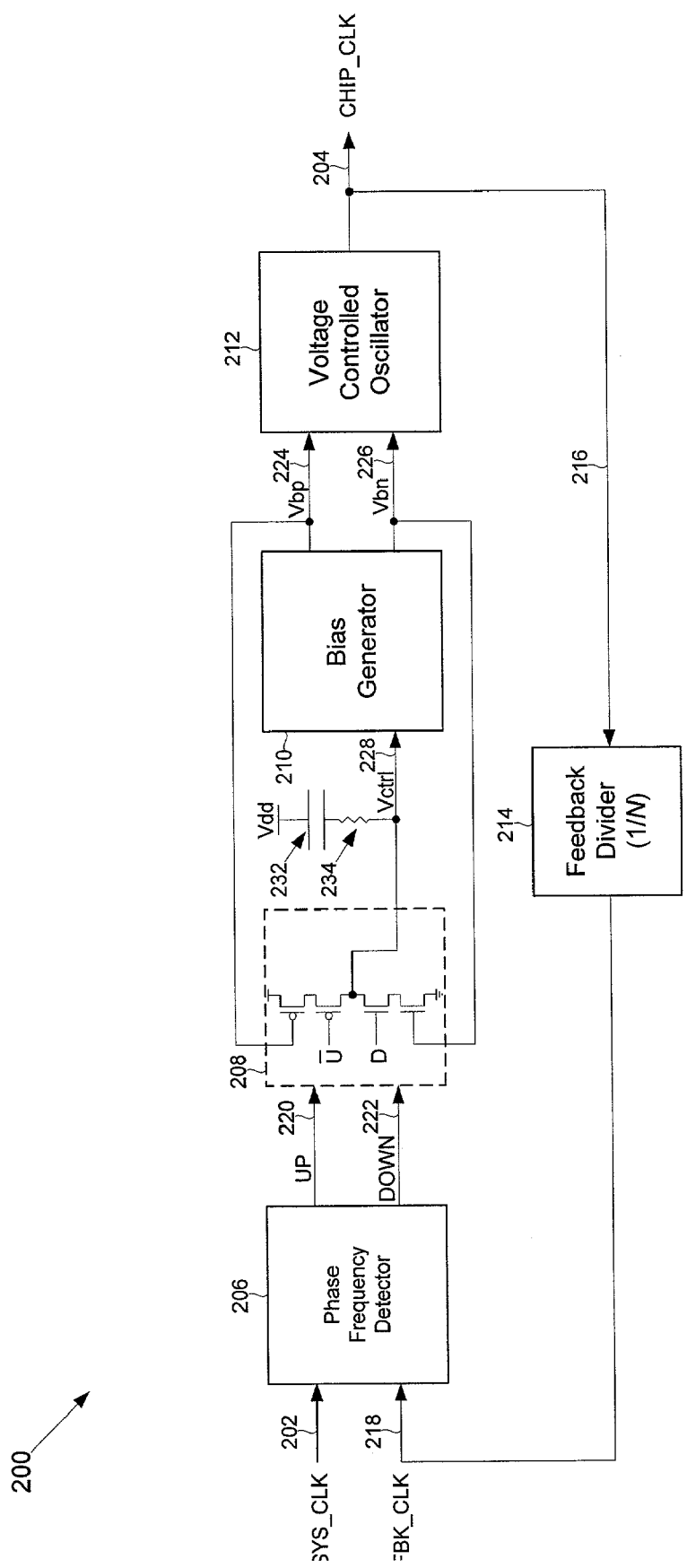
FIG. 3a shows a circuit diagram of a phase locked loop.

FIG. 3a shows a diagram of a PLL 200. A system clock, SYS_CLK 202, serves as an input to the PLL 200 and is used to create a phased output, chip clock 204. The basic elements of the PLL 200 are a phase frequency detector 206, a charge pump 208, a loop filter (discussed below), and a voltage controlled oscillator 212. Because the chip clock 204 is typically desired to have a significantly higher frequency than the system clock 202, a divide-by-N circuit 214 is positioned in a feedback loop 216 of the PLL 200. The divide-by-N circuit 214 is used to reduce, i.e., divide down, the frequency of the chip clock 204 so that the system clock 202 can be compared with a feedback clock, FBK_CLK 218.

The phase frequency detector 206 measures the phase and frequency difference between the system clock 202 and the feedback clock 218. Based on the comparison, the phase frequency detector 206 generates UP and DOWN signals 220 and 222 that control the charge pump 208 by causing the charge pump 208 to increase or decease the net charge at an output of the charge pump 208. Furthermore, as shown in FIG. 3a, an internal biasing of the charge pump 208 is dependent on bias signals, Vbp 224 and Vbn 226, generated by a bias generator 210. The charge pump 208 is arranged as such to guarantee that the charge pump 208 has some nominal current. Thus, depending on the UP and DOWN signals 220 and 222 and Vbp 224 and Vbn 226, the charge pump 208 adds or removes charge from a control voltage, Vctrl 228. The control voltage is further dependent on a loop filter formed by a capacitance 230 and a resistance 232.

The control voltage 228 serves as an input to the bias generator 210, which, as mentioned above, generates bias signals Vbp 224 and Vbn 226. Bias signals Vbp 224 and Vbn 226 are used to control the voltage controlled oscillator 212, which, in turn, generates the chip clock 204. Thus, the chip clock 204 has a frequency related to the bias signal inputs to the voltage controlled oscillator 212.

Those skilled in the art will note that because the input(s) to the voltage controlled oscillator 212 may be susceptible to power supply noise, the chip clock 204 may jitter. Accordingly, the amount of capacitance 230 in the loop filter helps determine how much of the power supply noise affects the voltage controlled oscillator 212.

Figure 3B:
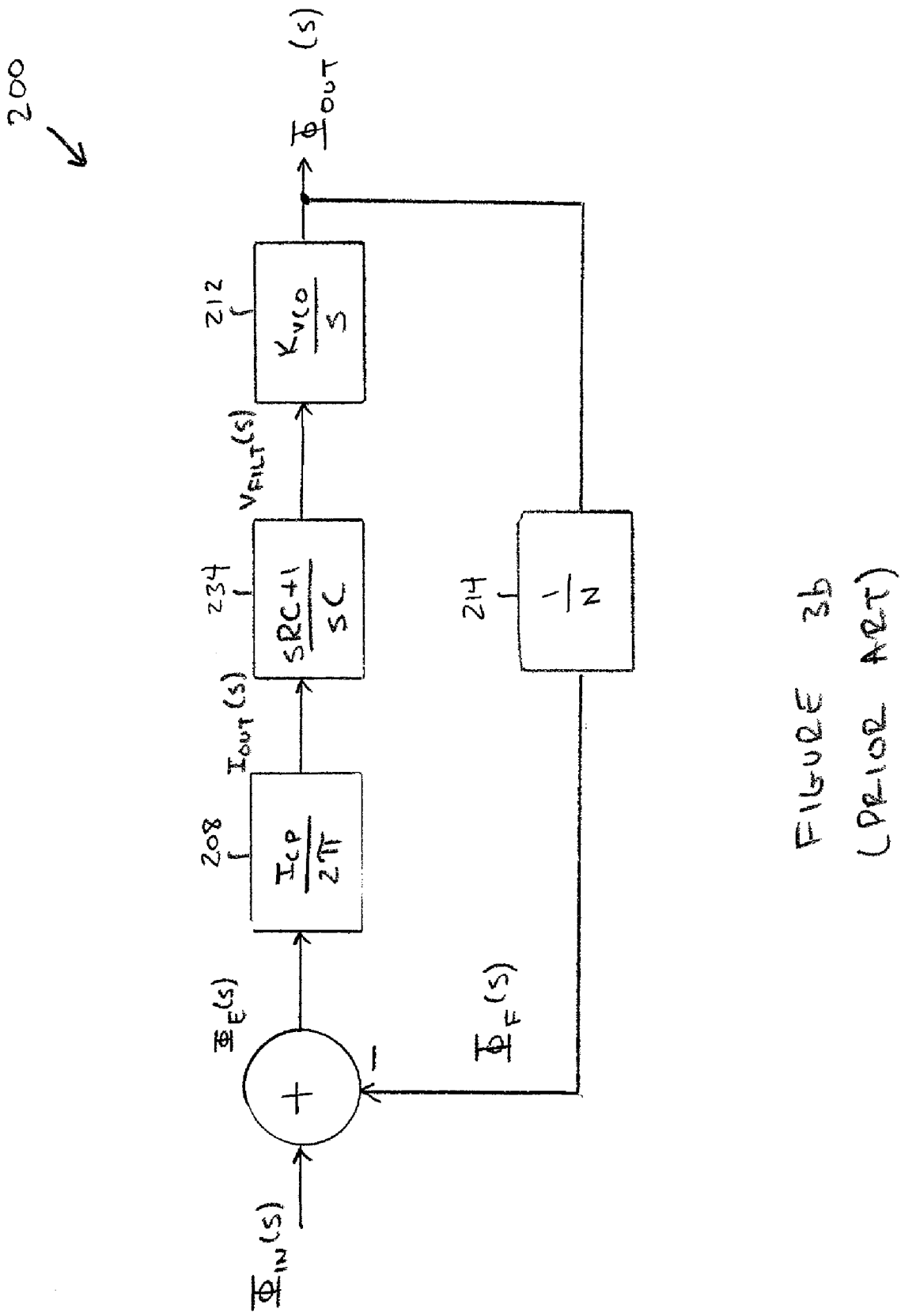
FIG. 3b shows a control diagram of a phase locked loop.

In FIG. 3b, the frequency response of the PLL 200 may be analyzed with a Laplace transform approximation, where the sample operation of the phase-frequency detector is ignored. This approximation is useful for loop bandwidths about a decade or more below the operating frequency of the PLL. This loop bandwidth constraint is also required for stability due to the reduced phase margin near the higher order poles that result from the delay around the sampled feedback loop. The modeled charge pump 208 adds or removes charge to its output depending on the state of input control pulse signals UP and DOWN 220 and 222 (shown in FIG. 3a). Both pulses may be 'on' at the same time, however, if one of the UP 220 and DOWN 222 pulse remains 'on' longer than the other, the net charge at the output of the charge pump 208 increases or decreases accordingly. The charge pump gain may be modeled as a linear gain versus phase error where $I_{OUT}(s)/\Phi_E(s)=I_{CP}/2\pi$. A loop filter 234 of the PLL may be modeled as a series combination of a capacitor, C, and a resistor, R, connected from $I_{OUT}$ to ground. The loop filter 234 transforms the output of the charge pump 208, $I_{OUT}$, into the voltage-controlled oscillator input voltage, $V_{FILT}$. The Laplace transform of the series resistor and capacitor in the loop filter 234 is $V_{FILT}(s)/I_{OUT}(s)=(sRC+1)/(sC)$. The transfer function of the capacitor and resistor shows that a zero is added that adds stability to the PLL loop. The voltage controlled oscillator 212 outputs a clock that has a frequency proportional to the input voltage $V_{FILT}$. The Laplace transform of the voltage controlled oscillator 212 is $\Phi_{OUT}(s)/V_{FILT}(s) = I_{CP}/V_{FILT}(s)=K_{VCO}/s$. The closed-loop transfer function can now be derived as $H(s)=\Phi_{OUT}(s)/\Phi_{IN}(s)=[(R\ K_{VCO}\ I_{CP}/2\pi)/(s+1/R\ C)]/[s^2+s\ R\ C\ K_{VCO}\ I_{CP}/2\pi\ N\ C+K_{VCO}\ I_{CP}/2\pi\ N\ C]$. H(s) is a second order system that has one pole from the loop filter 234 and one pole from the voltage controlled oscillator 212, and one zero from the resistor, R, in the loop filter 234. The transfer function H(s) has a natural frequency $\omega_n=(K_{VCO}\ I_{CP}/2\pi\ N\ C)^{0.5}$ and a damping factor $\zeta=R\ C\ \omega_n/2$.

The loop bandwidth is defined as the frequency at which the output magnitude is 3 dB lower than when the input is DC. Loop bandwidth is not the same as natural frequency, although they are often close. Once $\zeta$, $\omega_n$, $K_{VCO}$, and $I_{CP}$ are chosen, the values for R and C can be determined for any selected loop bandwidth. Low loop bandwidth allows the PLL to filter input error. High loop bandwidth allows the PLL to follow and compensate for output error induced by power supply noise. Thus, a design tradeoff must be made in the loop bandwidth of the PLL. The value for C has a large effect on loop bandwidth and natural frequency. Optimizing the PLL loop bandwidth relates to balancing the effect and treatment of input error with the PLL loop's speed of response to compensate for output error induced by power supply noise.

In order to facilitate the achievement of improved/optimal PLL performance, embodiments of the present invention relate to an adjustment and calibration system for post-fabrication treatment of a phase locked loop input receiver. The adjustment and calibration system includes at least one adjustment circuit, to which a phase locked loop input receiver is responsive, and a storage device that selectively stores control information (1) associated with a state of the adjustment circuit and/or (2) from a tester that writes such control information to the storage device, where the control information stored in the storage device is subsequently selectively read out in order to adjust the adjustment circuit to a state corresponding to the control information. Embodiments of the present invention further relate to a PLL that includes an input receiver that substantially matches a delay of a system clock path and a delay of a feedback clock path dependent on one or more bias signals, where the one or more bias signals are adjustable by one or more adjustment circuits operatively connected to the input receiver. Embodiments of the present invention further relate to a PLL that includes an input receiver that reduces a delay of a system clock path and a delay of a feedback clock path dependent on one or more bias signals, where the one or more bias signals are adjustable by one or more adjustment circuits operatively connected to the input receiver.

Figure 4A:
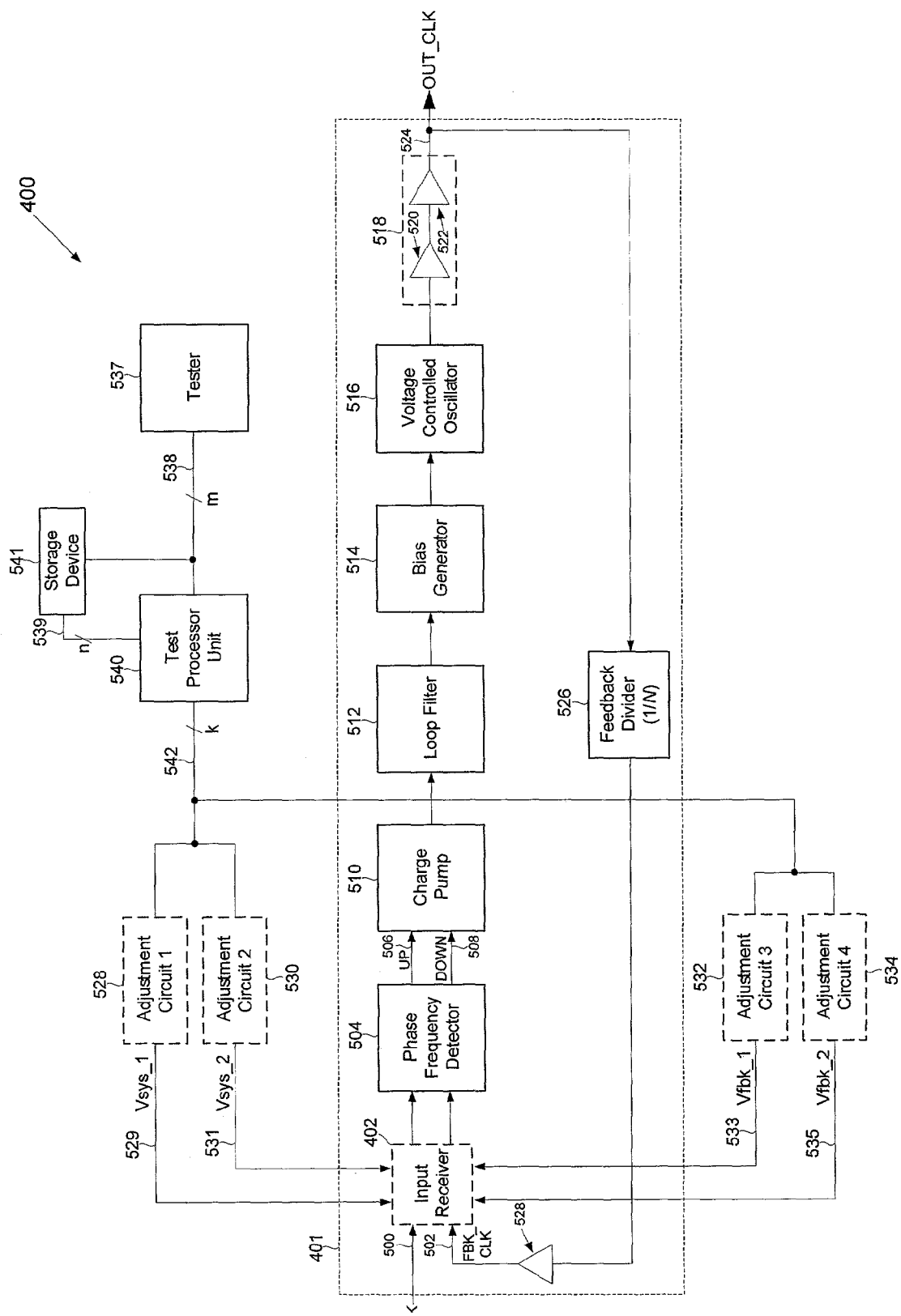
FIG. 4a shows a phase locked loop input receiver adjustment and calibration system in accordance with an embodiment of the present invention.
Figure 4B:
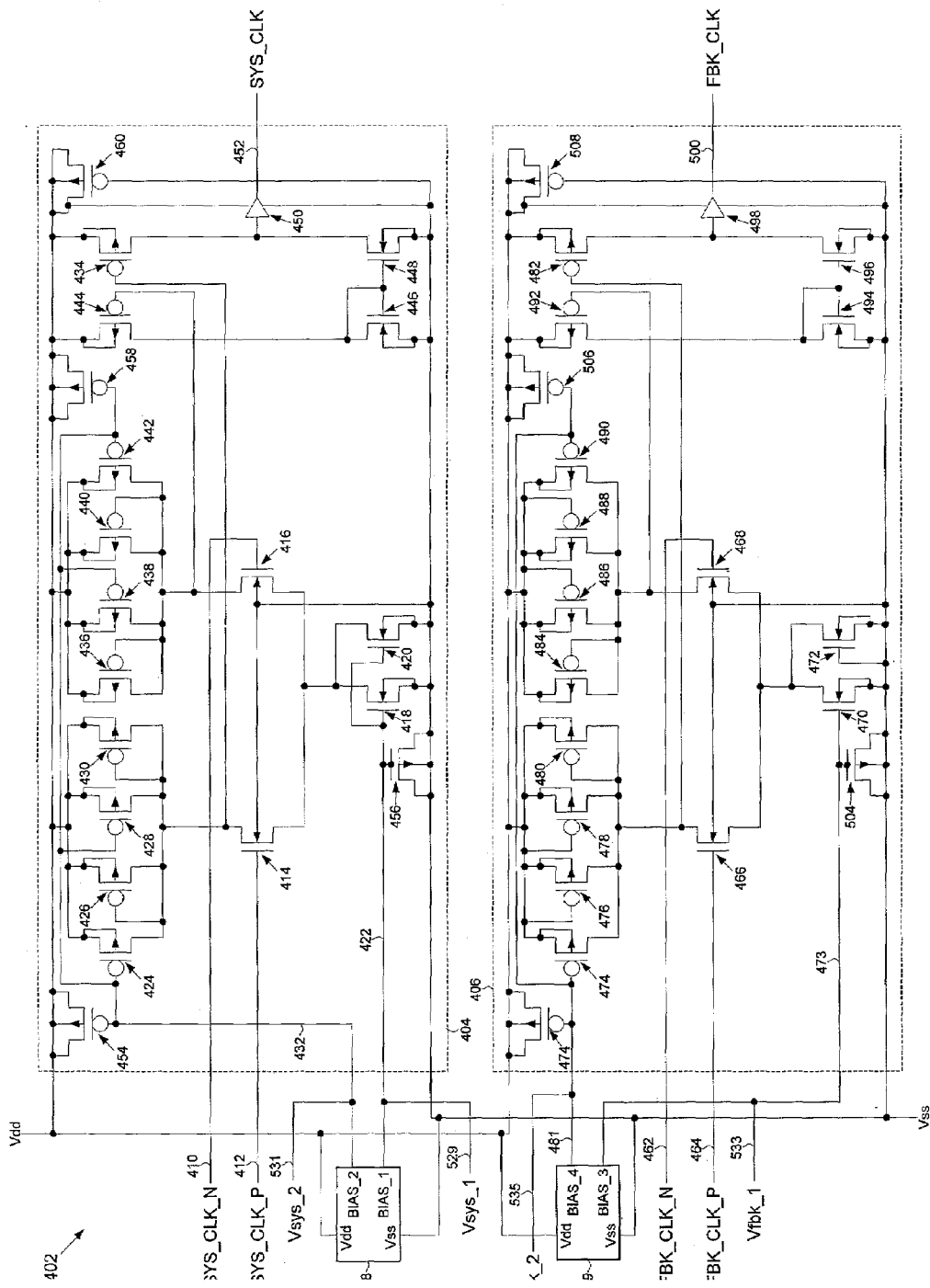

FIG. 4a shows an exemplary phase locked loop input receiver adjustment and calibration system 400 in accordance with an embodiment of the present invention. In FIG. 4a, a PLL 401 includes an input receiver 402 that inputs a system clock 500 (labeled in FIG. 4a as SYS_CLK) and a feedback clock 502 (labeled in FIG. 4a as FBK_CLK). The input receiver 402, as will be described below with reference to FIG. 4b, is controllable to match and/or minimize the delays of the system clock 500 and the feedback clock 502. The input receiver 402 is controllable due to being operatively connected to adjustment circuits 528, 530, 532, and 534 (a discussion of an embodiment of an adjustment circuit in accordance with the present invention is given below with reference to FIG. 7). The adjustment circuits 528, 530, 532, and 534 generate adjustment control voltages Vsys_1 529, Vsys_2 531, Vfbk_1 533, and Vfbk_2 535, respectively, The adjustment control voltages Vsys_1 529, Vsys_2 531, Vfbk_1 533, and Vfbk_2 535 are used to adjust internal bias signals of the input receiver 402 (discussed below with reference to FIG. 4b). Adjusting the internal bias signal values of the input receiver 402 modulates delays of the system clock 500 and the feedback clock 502. In embodiments of the present invention, the input receiver 402 may be adjusted to substantially match the delays of the system clock 500 and the feedback clock 502.

In FIG. 4a, a test processor unit 540 controls adjustment circuits 528, 530, 532, and 534 using k control signals 542. The values of the k control signals 542 are determined by the test processor unit 540. The test processor unit 540 may communicate through a host interface (not shown) using m communication lines 538. Those with ordinary skill in the art will appreciate that the host interface and m communication lines 538 may take a wide variety of forms. For example, the communication may be defined by an industry standard such as JTAG (IEEE 1149). Collectively, the k control signals 542 are referred to as "adjustment settings."

The host interface (not shown) may be used to operatively connect to a separate computer system. For example, a tester 537 may communicate with the test processor unit 540. The tester 537 may control the test processor unit 540 to adjust adjustment circuits 528, 530, 532, and 534 to modify an operating characteristics of the PLL 401. Moreover, the tester 537 may measure an operating characteristic of the PLL 401 or a representative operating characteristic of an integrated circuit on which the PLL 401 resides to determine the effect of the adjustment.

In some embodiments, more than one test processor unit may be used to control the adjustment circuits 528, 530, 532, and 534. In some embodiments, an adjustment circuit may be controlled by a particular test processor unit or a group of test processor units. In some embodiments, the input receiver 402 may be connected to a different number of adjustment circuits than the number of adjustment circuits shown in FIG. 4a.

As shown in FIG. 4a, a storage device 541 (discussed in detail below with reference to FIG. 6a) may be used to store control information representative of the adjustment settings (as discussed above) that produce desired operating characteristics of the PLL 401. By using the tester 537, control information may be written into the storage device 541. The tester 537 may read or rewrite the control information in the storage device 541.

In some embodiments, the storage device 541 may include multiple storage elements such that the control information may be represented by a binary word. For example, the control information stored in the storage device 541 may be a binary word that corresponds to values of the k control signals 542. Alternatively, the control information may be a binary encoded word. For example, if the k control signals 542 uses eight control signals, the control information might be represented with a three bit binary word. Further still, the control information may contain instructions, interpreted by the test processor unit 540, to control the k control signals 542.

In some embodiments, the PLL 401, or the integrated circuit on which the PLL 401 resides, may be removed from the tester 537. The test processor unit 540, via n signal lines 239, may read the storage device 541 to obtain the control information and determine suitable adjustment settings to be communicated to one or more adjustment circuits 528, 530, 532, and 534. Accordingly, after the test processor unit 540 reads the control information in the storage device 541 and adjusts one or more of the adjustment circuits 528, 530, 532, and 534, the PLL 401 may have an operating characteristic similar to the operating characteristics obtained while connected to the tester 537.

Still referring to FIG. 4a, the input receiver 402 outputs the delay matched system and feedback clocks to a phase frequency detector 504, which compares the phases of the delay matched system and feedback clocks. Depending on the comparison, the phase frequency detector 504 outputs UP and DOWN pulses 506 and 508 to a charge pump 510, the output of which is operatively connected to a loop filter 512. The loop filter 512 controls the voltage value of an input to a bias generator 514, which, in turn, controls a voltage controlled oscillator 516. An output from the voltage controlled oscillator 516 propagates through a clock distribution network 518 (modeled in FIG. 4a as buffers 520 and 522) and serves as an output clock 524 of the PLL 401 (labeled in FIG. 4a as CHIP_CLK). The output clock 524 is fed back through a feedback divider 526, which, in turn, outputs to a buffer 528 that generates the feedback clock 502 to the input receiver 402.

FIG. 4b shows an input receiver 402 in accordance with the exemplary embodiment shown in FIG. 4a. In general terms, the input receiver 402 uses a system clock path 404, a feedback clock path 406, a first bias control stage 408, and a second bias control stage 409.

The system clock path 404 includes a differential input pair for receiving differential components of the system clock, SYS_CLK_N 410 and SYS_CLK_P 412, where the differential input pair is formed by transistors 414 and 416. Current flow through transistor 414 is dependent on transistors 418 and 420 because a first non-gate terminal of transistor 414 is connected to non-gate terminal of transistors 418 and 420. Transistors 418 and 420 are controlled by a first bias signal, BIAS_1 422, generated from the first bias control stage 408. The first bias signal 422 is wire-ORed to adjustment control voltage Vsys_1 529 (also shown in FIG. 4a as being generated by adjustment circuit 528). Current flow through transistor 414 is also dependent on transistors 424, 426, 428, and 430 because a second non-gate terminal of transistor 414 is connected to non-gate terminals of transistors 424, 426, 428, and 430. Transistors 424, 426, 428, and 430 serve as load resistances. The effective resistance values of transistors 424 and 428 are dependent on a second bias signal, BIAS_2 432, generated from the first bias control stage 408. The second bias signal 432 is wire-ORed to adjustment control voltage Vsys_2 531 (also shown in FIG. 4a as being generated by adjustment circuit 530). The resistance values of transistors 426 and 430 are not dependent on the second bias signal 432. Further, as shown in FIG. 4b, an input to transistor 434 is connected to a non-gate terminal of transistor 414 and is thus dependent on the amount of current flow through transistors 424, 426, 428, 430, 414, 418, and 420.

Current flow through transistor 416 is dependent on transistors 418 and 420 because a first non-gate terminal of transistor 416 is connected to non-gate terminal of transistors 418 and 420. As mentioned above, transistors 418 and 420 are controlled by the first bias signal 422. Current flow through transistor 416 is also dependent on transistors 436, 438, 440, and 442 because a second non-gate terminal of transistor 416 is connected to non-gate terminals of transistors 436, 438, 440, and 442. Transistors 436, 438, 440, and 442 serve as load resistances, where the resistance values of transistors 438 and 442 are dependent on the second bias signal 432, and where the resistance values of transistors 436 and 440 are not dependent on the second bias signal 432. Further, as shown in FIG. 4b, an input to transistor 444 is connected to a non-gate terminal of transistor 416 and is thus dependent on the amount of current flow through transistors 436, 438, 440, 442, 416, 418, and 420.

Based on the input to transistor 444, a particular amount of current flows to a non-gate terminal of transistor 446 and to gate terminals of transistors 446 and 448. A non-gate terminal of transistor 448 is connected to an input of a buffer 450, where the buffer 450 outputs the system clock, SYS_CLK 452. A non-gate terminal of transistor 434 is also connected to the input of the buffer 450. Thus, the value of the system clock 452 is dependent on the inputs to transistors 434 and 444.

For purposes of this description, transistors 444, 446, 448, and 434 and buffer 450 form a "first output stage." In addition, those skilled in the art will understand that transistors 454, 456, 458, and 460 serve as transistor-formed capacitances that are used to decouple noise from particular signals.

The feedback clock path 406 includes a differential input pair for receiving differential components of the system clock, FBK_CLK_N 462 and FBK_CLK_P 464, where the differential input pair is formed by transistors 466 and 468. Current flow through transistor 466 is dependent on transistors 470 and 472 because a first non-gate terminal of transistor 466 is connected to non-gate terminal of transistors 470 and 472. Transistor 470 is controlled by a third bias signal 473 generated from the second bias control stage 409, where the third bias signal 473 is wire-ORed to adjustment control voltage Vfbk_1 533 (also shown in FIG. 4a as being generated by adjustment circuit 532). Transistor 472 is not dependent on the third bias signal 473. Current flow through transistor 466 is also dependent on transistors 474, 476, 478, and 480 because a second non-gate terminal of transistor 466 is connected to non-gate terminals of transistors 474, 476, 478, and 480. Transistors 474, 476, 478, and 480 serve as load resistances, where the resistance value of transistor 474 is dependent on a fourth bias signal 481 generated from the second bias control stage 409. The fourth bias signal 481 is wire-ORed to adjustment control voltage Vfbk_2 535 (also shown in FIG. 4a as being generated by adjustment circuit 534). The resistance value of transistor 480 is not dependent on the fourth bias signal 481 and transistors 476 and 478 are 'off' due to their inputs being connected to Vdd. Further, as shown in FIG. 4b, an input to transistor 482 is connected to a non-gate terminal of transistor 466 and is thus dependent on the amount of current flow through transistors 474, 480, 466, 470, and 472.

Current flow through transistor 468 is dependent on transistors 470 and 472 because a first non-gate terminal of transistor 468 is connected to non-gate terminal of transistors 470 and 472. As mentioned above, transistor 470 is controlled by the first bias signal 422 and transistor 472 operates independently of the first bias signal 422. Current flow through transistor 468 is also dependent on transistors 484, 486, 488, and 490 because a second non-gate terminal of transistor 468 is connected to non-gate terminals of transistors 484, 486, 488, and 490. Transistors 484, 486, 488, and 490 serve as load resistances. The resistance value of transistor 490 is dependent on the second bias signal 432. The resistance value of transistor 484 is not dependent on the second bias signal 432 and transistors 486 and 488 are 'off' due to their inputs being connected to Vdd. Further, as shown in FIG. 4b, an input to transistor 492 is connected to a non-gate terminal of transistor 468 and is thus dependent on the amount of current flow through transistors 484, 490, 468, 470, and 472.

Based on the input to transistor 492, a particular amount of current flows to a non-gate terminal of transistor 494 and to gate terminals of transistors 494 and 496. A non-gate terminal of transistor 496 is connected to an input of a buffer 498, where the buffer 498 outputs the feedback clock, FBK_CLK 500. A non-gate terminal of transistor 482 is also connected to the input of the buffer 498. Thus, the value of the feedback clock 500 is dependent on the inputs to transistors 482 and 492.

For purposes of this description, transistors 492, 494, 496, and 482 and buffer 498 form a "second output stage." In addition, those skilled in the art will understand that transistors 502, 504, 506, and 508 serve as transistor-formed capacitances that are used to decouple noise from particular signals.

By adjusting the second and fourth bias signal 432 and 481, the effective load resistances of (1) transistors 424, 426, 428, and 430, (2) transistors 436, 438, 440, and 44, (3) transistors 474, 476, 478, and 480, and (4) transistors 484, 486, 488, and 490 may be varied. Similarly, by adjusting the first and third bias signals 422 and 473, the flow of current (1) through transistors 418 and 420 to transistor 414, (2) through transistors 418 and 420 to transistor 416, (3) through transistor 470 to transistor 466, and (4) through transistor 470 to transistor 468 may be varied. Those skilled in the art will appreciate that by varying the dynamics of the input receiver 402, a point of operation may be achieved at which the propagation delay of the system clock through the input receiver 402 and the propagation delay of the feedback clock through the input receiver 402 substantially match. Further, those skilled in the art will appreciate that by facilitating a control of the propagation delays of the system and feedback clocks through the input receiver 402, the propagation delays of the system and feedback clocks may also be minimized. By altering the delays of a system clock and a feedback clock at an input of a PLL, static phase error of the PLL may be reduced.

In addition to substantially matching the propagation delays of the system and feedback clocks through the input receiver 402, the input receiver 402 outputs buffered versions of the system and feedback clocks.

Figure 5:
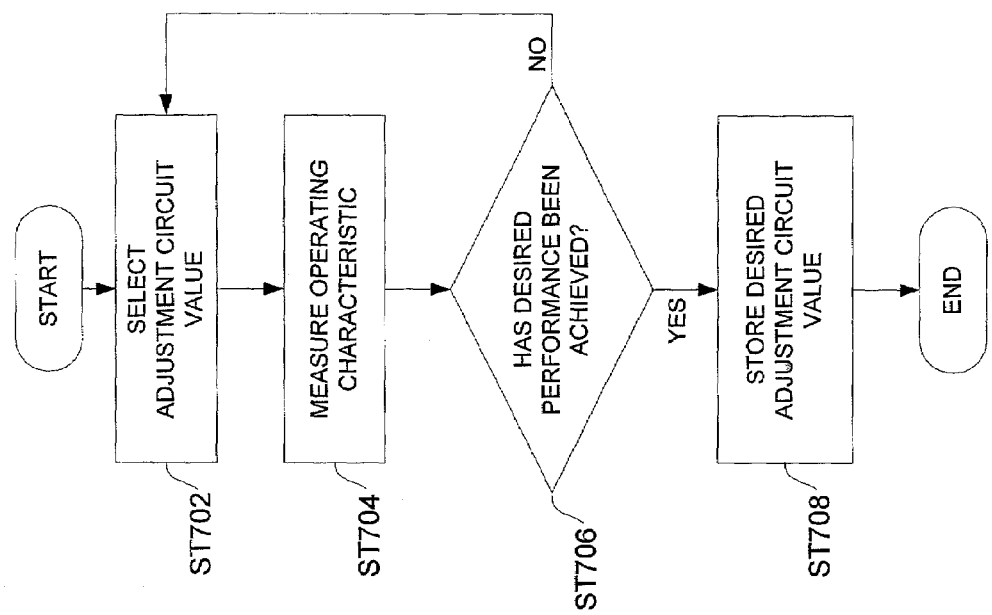
FIG. 5 shows a flow process in accordance with an embodiment of the present invention.

FIG. 5 shows a flow process in accordance with an embodiment of the present invention. At 702, an adjustment circuit value is selected. The selected adjustment value is used to adjust one or more of adjustment circuits 528, 530, 532, and 534 (shown in FIG. 4a). The adjustment circuits 528, 530, 532, and 534 are used to match delays of the system clock and the feedback clock of a PLL (shown in FIG. 4a). In 704, the operating characteristics that ensue from an adjustment of the PLL 401 (in FIG. 4a) based on the adjustment circuit value is measured.

In 706, a determination is made as to whether a desired performance level is achieved. The determination may be based on an actual measurement taken with the selected adjustment circuit value, or an interpolation or extrapolation from data obtained from selectively adjusting the adjustment circuit value. If the desired performance level is not achieved, 702 and 704 are repeated until a desired adjustment circuit value and performance level is achieved. If the desired performance level is achieved, the corresponding adjustment circuit value, or a representation of the value, is stored in 708. The desired adjustment circuit value, or representation of the value, is the control information stored in the storage device 541 (shown in FIG. 4a). As discussed above, the storage device 541 can be used to store control information that may be accessed and used to improve the performance of the PLL 401 after fabrication.

Figure 6A:
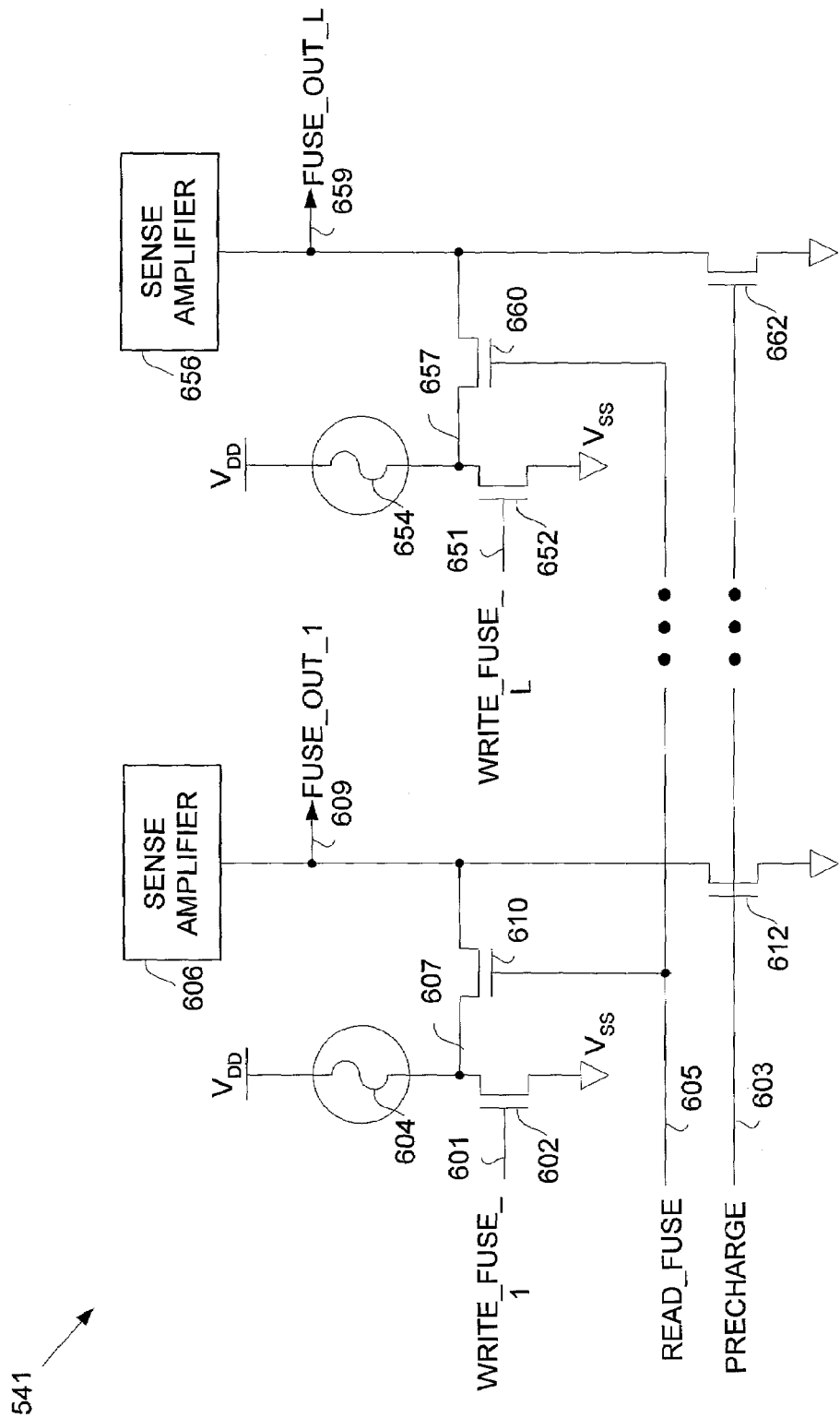
FIG. 6a shows a storage device in accordance with an embodiment of the present invention.

FIG. 6a shows an exemplary storage device 541 in accordance with an embodiment of the present invention. The storage device 541 includes electrically programmable fuses 604 and 654 to store nonvolatile control information. Multiple write signals, such as WRITE_FUSE_1 601 through WRITE_FUSE_L 651, are used to program electrically programmable fuses 604 and 654, respectively. A "high" voltage on WRITE_FUSE_1 601 and WRITE_FUSE_L 651 cause n-channel transistors 602 and 652, respectively, to turn "on." If n-channel transistors 602 and 652 are "on" for a sufficient duration, the fuse 604 and fuse 654, respectively, create an "open" circuit. A PRECHARGE signal 603 pulses "high" on the gates of n-channel transistors 612 and 662 to momentarily turn them "on." If n-channel transistors 612 and 662 are "on," FUSE_OUT_1 609 and FUSE_OUT_L 659 is pulled "low" by n-channel transistors 612 and 662. The "low" voltage on FUSE_OUT_1 609 and FUSE_OUT_L 659 precharge FUSE_OUT_1 609 and FUSE_OUT_L 659 in anticipation of a read operation.

A "high" voltage on READ_FUSE 605 causes n-channel transistors 610 and 660 to turn "on." If any of the fuses 604 and 654 are intact, i.e., shorted, FUSE_OUT_1 609 and FUSE_OUT_L 659 are respectively pulled "high." If any of the fuses 604 and 654 are open, FUSE_OUT_1 609 and FUSE_OUT_L 659 remain "low." The sense amplifiers 606 and 656 sense the voltage levels on FUSE_OUT_1 609 and FUSE_OUT_L 659, respectively, to amplify and maintain the voltage levels.

Figure 6B:
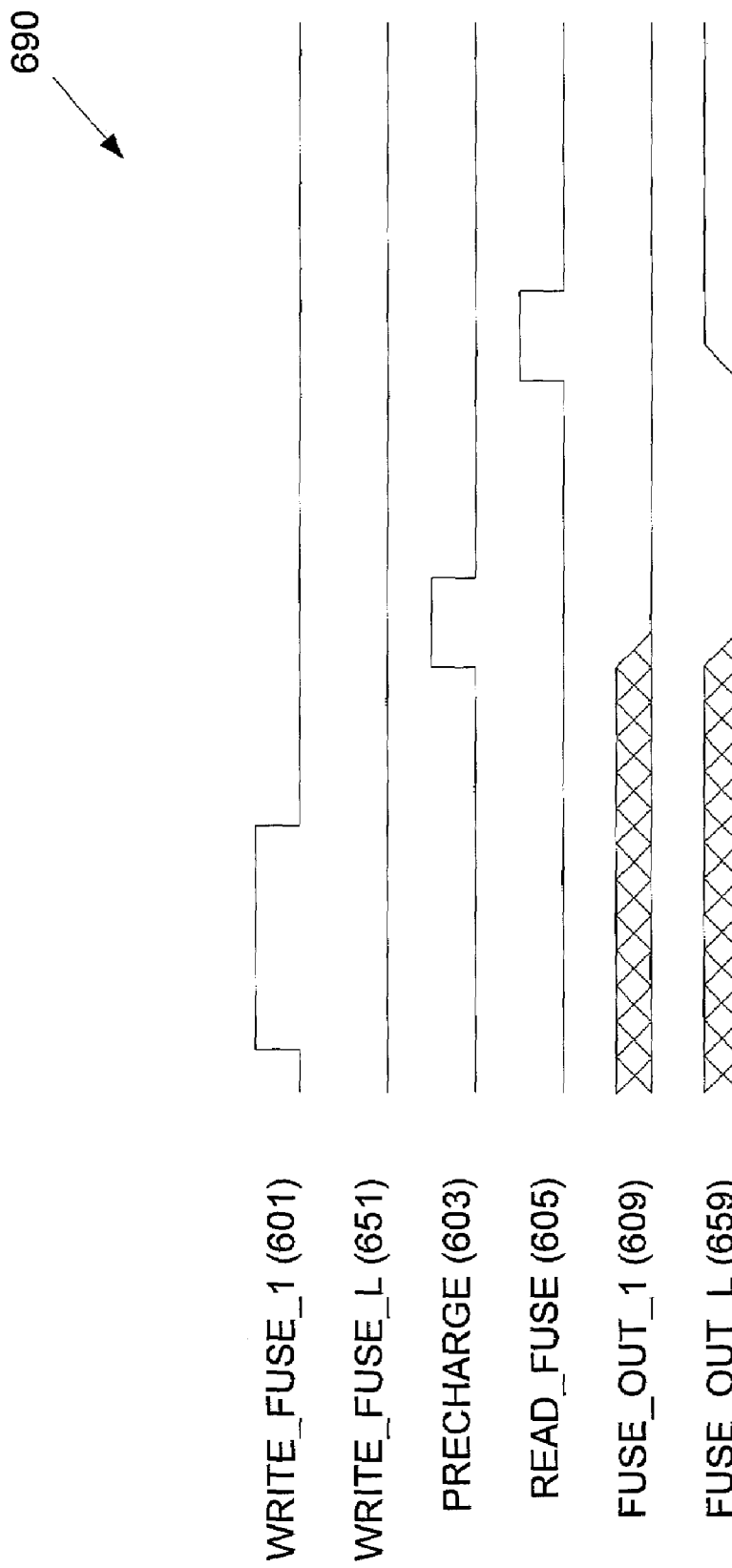

FIG. 6b shows a timing diagram 690 related to the programming of storage device 541 in accordance with an embodiment of the present invention. In this example, WRITE_FUSE_1 601 is pulsed to a "high" voltage to create an "open" on fuse 604. WRITE_FUSE_L 651 remains at a "low" voltage to leave fuse 604 intact. PRECHARGE 603 pulses "high" to pull FUSE_OUT_1 609 and FUSE_OUT_L 659 to a "low" voltage. READ_FUSE 605 pulses "high" to read the state of the fuses 604 and 654. Because fuse 604 is "open," FUSE_OUT_1 609 remains at a "low" voltage. Because fuse 654 is intact, or "shorted," FUSE_OUT_L 659 is pulled "high."

Because the fuses 604 and 654 have been programmed and read, FUSE_OUT_1 609 and FUSE_OUT_L 659 maintain the programmed control information. The state of the fuses 604 and 654 may be read at any time by observing the voltage level on FUSE_OUT_1 609 and FUSE_OUT_L 659. Also, the state of the fuses 604 and 654 may be read by repeating the precharge and read cycles. Using multiple fuses and related circuitry, a binary word may represent the stored control information.

One of ordinary skill in the art will appreciate that the electrically programmed fuses are but one method to store information. Those skilled in the art will appreciate that the storage device 541 may contain a wide variety of types of storage elements including, but not limited to, an electrically programmed fuse, an electrically programmed read only memory (EPROM), an electrically erasable read only memory, a one time programmable memory, a flash memory, a laser programmed fuse, and a laser programmed anti-fuse.

Figure 7:
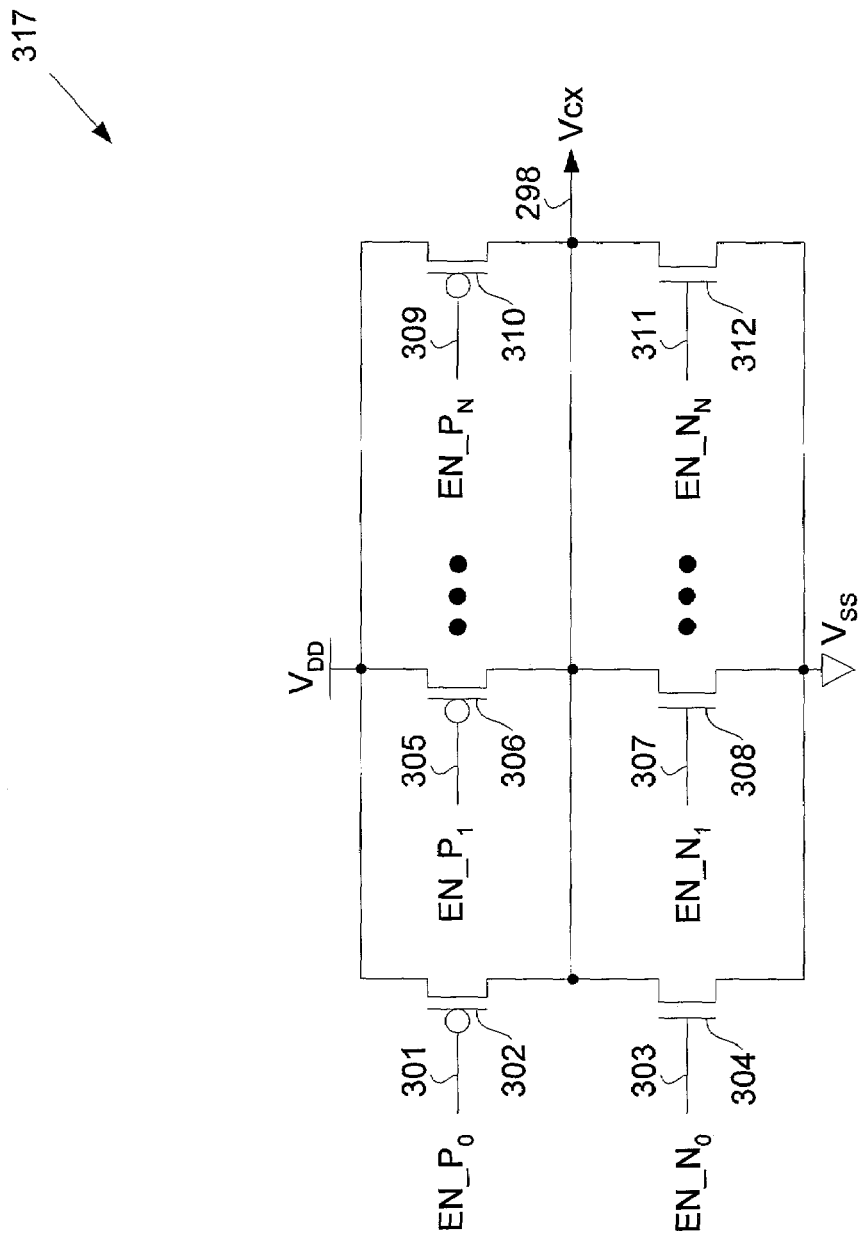
FIG. 7 shows an adjustment circuit in accordance with an embodiment of the present invention.

FIG. 7 shows an exemplary adjustment circuit 317 in accordance with an embodiment of the present invention. Those skilled in the art will understand that the adjustment circuit 317 shown in FIG. 7 is representative of the adjustment circuits 528, 530, 532, and 534 shown in FIG. 4a.

In FIG. 7, the adjustment circuit 317 includes p-channel transistors 302, 306, and 310 arranged in parallel with each other. The p-channel transistors 302, 306, and 310 connect between a power supply, Vdd, and a common node, Vcx 298. Those skilled in the art will note that the common node Vcx 298 corresponds to Vsys_1 529, Vsys_2 531, Vfbk_1 533, and Vfbk_2 535 in FIG. 4a. Still referring to FIG. 7, the adjustment circuit 317 also includes n-channel transistors 304, 308, and 312 arranged in parallel with each other. The n-channel transistors 304, 308, and 312 connect between ground, Vss, and the common node 298. The p-channel transistors 302, 306, and 310 are controlled by control signals $EN\_P_0$ 301, $EN\_P_1$ 305, and $EN\_P_N$ 309, respectively. The n-channel transistors 304, 308, and 312 are controlled by control signals $EN\_N_0$ 303, $EN\_N_1$ 307, and $EN\_N_N$ 311, respectively. A low voltage on any of the EN_P signals 301, 305, and 309 will turn 'on' their respective p-channel transistors 302, 306, and 310. A high voltage on any of the EN_N signals 303, 307, and 311 will turn 'on' their respective n-channel transistors 304, 308, and 312.

Any p-channel transistor 302, 306, and 310 that is 'on' will increase the voltage on Vcx 298 toward Vdd. Any n-channel transistor 304, 308, and 312 that is 'on' will have a tendency to lower the voltage on Vcx 298 toward Vss. By selecting which p-channel transistors 302, 306, and 310 and/or n-channel transistors 304, 308, and 312 are 'on,' a selected change in the voltage on Vcx 298 may be achieved.

The p-channel transistors 302, 306, and 310 and n-channel transistors 304, 308, and 312 may be turned 'on' individually or as a group. The p-channel transistors 302, 306, and 310 and n-channel transistors 304, 308, and 312 may be sized so that each transistor has a different effect compared to the other transistors, e.g., a transistor's gate width may be varied to adjust the strength of the transistor. The gate widths may be designed to provide a linear, exponential, or other function as more transistors are turned 'on.' The p-channel transistors 302, 306, and 310 and n-channel transistors 304, 308, and 312 may be sized so that each transistor has an inherently resistive nature, e.g., a transistor's gate length may be increased ('long-channel' transistors) to increase the inherent resistance of the transistor. A larger inherent resistance may be advantageous if both a p-channel transistor and a n-channel transistor are 'on' simultaneously. In other embodiments, the adjustment circuit 317 may include only one p-channel transistor and one n-channel transistor connected in series.

The k control signals 542 in FIG. 4a may represent EN_N signals 303, 307, and 311 in FIG. 7 and EN_P signals 301, 305, and 309 in FIG. 7. In other words, the k control signals 542 in FIG. 4a are used to turn 'on' or 'off' the p-channel transistors 302, 306, and 310 in FIG. 7 and n-channel transistors 304, 308, and 312 in FIG. 7.

As mentioned above with reference to FIGS. 4a and 4b, by selectively controlling an adjustment circuit, such as the one shown in FIG. 7, the adjustment circuit may be used to adjust a particular bias signal within an input receiver of a phase locked loop, thereby adjusting current and resistive properties of particular circuitry within the input receiver in order to attain a desired propagation delay of a signal responsive to the particular circuitry.

Advantages of the present invention may include one or more of the following. In some embodiments, because a phase locked loop includes an input receiver that facilitates the matching of delays of a system clock and a feedback clock at an input to the phase locked loop, static phase error of the phase locked loop may be reduced.

A PLL, in a post-fabrication stage, i.e., after fabrication, may demonstrate operating characteristics that may not have been apparent from simulation. In some embodiments, because one or more adjustment circuits may be used to modify the operating characteristics of the PLL, the PLL may be calibrated.

In some embodiments, because a PLL may be fabricated with a means for adjusting the current output of a charge pump, fewer design iterations and higher confidence in PLL operating characteristics may be afforded. Likewise, PLL response to various system disturbances such as power supply noise and system clock signal jitter may be realistically determined and calibrated to minimize these effects.

In some embodiments, a tester and a test processor unit may communicate so that the state of a PLL may be obtained, performance characteristics analyzed, and/or adjustments made to the PLL. By using the tester, control information may be stored in a storage device.

In some embodiments, a tester may take a relatively long to determine the desired value and program control information. Because the control information is programmed, the PLL and the integrated circuit on which it resides may quickly adjust the PLL to obtain proper operation.

In some embodiments, a limited number of PLLs may need to be tested to determine the desired value for the control information for a larger number of PLLs.

In some embodiments, because a phase locked loop includes an input receiver that facilitates the reducing of delays of a system clock and a feedback clock at an input to the phase locked loop, phase locked loop performance may be improved.

In some embodiments, because a phase locked loop includes an input receiver that is selectively controllable to vary/adjust delays of a system clock and a feedback clock, a designer has increased flexibility in achieving desired phase locked loop performance.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a power supply;
   a phase locked loop operatively connected to the power supply, the phase locked loop comprising:
      a voltage controlled oscillator that generates an output clock signal dependent on an input thereto,
      an input receiver comprising a system clock path and a feedback clock path,
      a phase frequency detector operatively connected to an output of the input receiver, and
      a bias generator, operatively connected to an output of the phase frequency detector, arranged to provide a voltage to the input of the voltage controlled oscillator;
   an adjustment circuit having an output operatively connected to the input receiver, wherein any one of the system clock path and the feedback clock path is responsive to the adjustment circuit; and
   a storage device adapted to store control information, wherein the storage device is operatively connected to the adjustment circuit.

2. The integrated circuit of claim 1, wherein the control information is determined based on a state of the adjustment circuit.

3. The integrated circuit of claim 1, further comprising:
   a tester operatively connected to the storage device, wherein the tester is adapted to selectively write at least a portion of the control information to the storage device.

4. The integrated circuit of claim 3, further comprising:
   a test processor unit operatively connected to the storage device and the adjustment circuit, wherein the tester is adapted to communicate with the test processor unit.

5. The integrated circuit of claim 4, wherein the test processor unit is adapted to selectively read at least a portion of the control information from the storage device in order to selectively adjust the adjustment circuit.

6. The integrated circuit of claim 4, wherein the test processor unit is adapted to selectively write at least a portion of the control information to the storage device.

7. The integrated circuit of claim 1, further comprising:
   a tester operatively connected to the storage device, wherein the tester is adapted to selectively read at least a portion of the control information from the storage device.

8. The integrated circuit of claim 1, wherein the storage device comprises at least one storage element, and wherein the storage element is at least one selected from the group consisting of an electrically programmable fuse, an electrically programmable read only memory, an electrically erasable read only memory, a one-time programmable memory, a flash memory, a laser programmable fuse, and a laser programmable anti-fuse.

9. The integrated circuit of claim 1, wherein the control information comprises a binary word.

10. The integrated circuit of claim 1, wherein the control information comprises an instruction.

11. The integrated circuit of claim 1, wherein the adjustment circuit comprises:
    a first device adapted to selectively control current flow between a power supply and the output of the adjustment circuit; and
    a second device adapted to selectively control current flow between the output of the adjustment circuit and ground.

12. The integrated circuit of claim 11, wherein the first device is a p-channel transistor and the second device is an n-channel transistor, and wherein the p-channel transistor and the n-channel transistor are arranged in series.

13. The integrated circuit of claim 11, wherein the adjustment circuit further comprises a third device arranged in parallel with the first device.

14. The integrated circuit of claim 11, wherein the adjustment circuit further comprises a third device arranged in parallel with the second device.

15. The integrated circuit of claim 1, wherein the system clock path is arranged to input a system clock signal, and wherein the feedback clock path is arranged to receive a feedback clock signal.

16. The integrated circuit of claim 15, wherein the feedback clock signal is dependent on the output clock signal.

17. An integrated circuit, comprising:
    means for supplying power;
    phase locked loop means for inputting a system clock signal and outputting an output clock signal, wherein the phase locked means is operatively connected to the means for supplying power, the phase locked loop means comprising:
        means for inputting the system clock signal and a feedback clock signal,
        means for generating a control voltage, wherein the means for generating the control voltage is operatively connected to the means for inputting the system clock signal and the feedback clock signal,
        means for generating a bias voltage, wherein the means for generating the bias voltage is operatively connected to the control voltage, and
        means for generating the output clock signal, wherein the means for generating the output clock signal is operatively connected to the means for generating the bias voltage;
    means for adjusting the means for inputting the system clock signal and the feedback clock signal; and
    means for storing control information to which the means for adjusting the means for inputting the system clock signal and the feedback clock signal is selectively responsive.

18. A method for post-fabrication treatment of an input receiver of a phase locked loop, comprising:
    inputting a system clock signal and a feedback clock signal to the input receiver;
    selectively adjusting a delay of any one of the system clock signal and the feedback clock signal using an adjustment circuit of which an output is operatively connected to the input receiver, the phase locked loop being responsive to any one of the system clock signal and the feedback clock signal; and
    storing at least a portion of control information determined from the selectively adjusting in a storage device, the at least a portion of the control information to which the adjustment circuit is selectively responsive.

19. The method of claim 18, the at least a portion of the control information being determined based on a state of the adjustment circuit.

20. The method of claim 18, the storing device comprising a storage element, the storage element being at least one selected from the group consisting of an electrically programmable fuse, an electrically programmable read only memory, an electrically erasable read only memory, a one-time programmable memory, a flash memory, a laser programmable fuse, and a laser programmable anti-fuse.

21. The method of claim 18, the selectively adjusting comprising:
    controlling a first current flow between a power supply and the output of the adjustment circuit; and
    controlling a second current flow between the output of the adjustment circuit and ground.

* * * * *